(12) United States Patent
Lee

(10) Patent No.: US 6,211,700 B1
(45) Date of Patent: Apr. 3, 2001

(54) DATA TRANSFER DEVICE WITH A POST CHARGE LOGIC

(75) Inventor: Jae Jin Lee, Ichon (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/342,068

(22) Filed: Jun. 29, 1999

(30) Foreign Application Priority Data

Jun. 29, 1998 (KR) .................................................. 98-24837

(51) Int. Cl.[7] .................... H03K 19/096; H03K 19/0185

(52) U.S. Cl. ............................... 326/82; 326/93; 326/112

(58) Field of Search .................................. 326/82, 93, 95, 326/98, 96, 97, 83, 112, 119, 121

(56) References Cited

U.S. PATENT DOCUMENTS

| | | | |
|---|---|---|---|
| 5,479,646 | 12/1995 | Proebsting | ............................ 395/494 |
| 5,532,622 | * 7/1996 | Beiley et al. | ............................ 326/95 |
| 5,543,735 | * 8/1996 | Lo | .......................... 326/93 |
| 5,767,700 | 6/1998 | Lee | .......................... 326/86 |
| 6,087,855 | * 7/2000 | Frederick, Jr. et al. | ................ 326/98 |

* cited by examiner

*Primary Examiner*—Michael Tokar
*Assistant Examiner*—Don Phu Le
(74) *Attorney, Agent, or Firm*—Nath & Associates PLLC; Gary M. Nath

(57) ABSTRACT

A data transfer device having a post charge logic circuit which utilizes signals on a pair of data lines performs a post charge operation on the other a plurality of data line pairs. A data transfer device uses only signals on a pair of data lines to perform the post charge operation to the other data lines, thereby reducing the area of the memory device.

6 Claims, 2 Drawing Sheets

DATA TRANSFER DEVICE WITH A POST CHARGE LOGIC

BACKGROUND OF THE INVENTION

1. Field of the Invention

The present invention relates to a data transfer device with a post charge logic. In particular, it relates to a data transfer device with a post charge logic, which initializes data lines in a memory device after data is transferred.

2. Description of the Prior Art

In general, a post charge operation is to initialize data lines by using the signals transferred on the data lines, after a data receiving circuit has received data outputted from a data transferring circuit through the data lines.

FIG. 1 represents a circuit diagram of a conventional data transfer device with a post charge logic circuit. In the diagram, each of the data bus sense amplifiers 10 and 40 is coupled to the corresponding receiving parts 20 and 50 through corresponding data line pairs DL1, DL2 and DL3, DL4.

The data bus sense amplifiers 10 and 40 transfer high/low level data to the receiving part 20 and 50 through the corresponding data line pairs DL1, DL2 and DL3, DL4. This is conducted by controlling the data driving elements N1, N2, N3, and N4 provided between the data lines DL1, DL2, DL3, and DL4 and ground voltage.

As shown in FIG. 1, post charge logic circuits 30 and 32 are provided on the data line pair DL1 and DL2 to initialize the data lines after the data has been transferred from the data bus sense amplifier 10 to the data lines. Post charge logic circuits 60 and 62 are provided on the data line pair DL3 and DL4 to initialize the data lines after the data has been transferred from the data bus sense amplifier 40 to the data lines.

The post charge logic circuit 30 comprises an inverter circuit 30a for receiving data on the data line DL1, delay circuit 30b for delaying the output signal from the inverter 30a for a predetermined time, an inverter circuit 30c for receiving the output signal from the delay circuit 30b, and a switching element P1 (wherein P1 is a PMOS transistor) for controlling the voltage level on the data line DL1 in response to an output signal from the inverter 30c. The construction of the other post charge logic circuits 32, 60, and 62 is identical with that of the post charge logic circuit 30.

The operation of the conventional data trnsfer device with a post charge logic in consideration of the operations of the data bus sense amplifier and the receiving part will be expalined hereinafter in detail.

The operation which transfers high level data to the receiving parts will be illustrated. At the beginning, the voltage levels of the data lines DL__1, and DL__2 are predetermined by a pheriperal circuit (not shown), and generally are set to a high level. When one (for example, N1) of the data driving elements N1 and N2 is turned on in response to the output signal from the data bus sense amplifier 10, the voltage level of the data line DL1 is changed from a high level to a low level.

In the beginning, the PMOS transistor P1 within the post charge logic circuit 30 is turned off until the data line DL1 has changed from a high level to a low level, thus the voltage of the data line DL1 is high level. When the voltage level of the data line DL1 has changed to a low level, the PMOS P1 will be turned on after a time lapse.

Therefore, the voltage level of the data line DL1 is initialized in response to the turned on PMOS transistor P1 after the signal of high data has been transferred to the receiving part.

On the contrary, the operation which transfers high level data to the receiving parts will be illustrated. At the beginning, the voltage levels of the data lines DL__1, and DL__2 are predetermined by a pheriperal circuit (not shown), and generally are set to a high level. When one (for example, N2) of the data driving elements N1 and N2 is turned on in response to the output signal from the data bus sense amplifier 10, the voltage level of the data line DL2 is changed from a high level to a low level. The PMOS transistor P2 within the post charge logic circuit 32 is turned off until the data line DL2 has changed from a high level to a low level, thus the voltage of the data line DL2 is high level.

When the voltage level of the data line DL2 has changed to a low level, the PMOS P2 will be turned on after a time lapse.

Therefore, the voltage level of the data line DL2 is initialized in response to the turned on PMOS transistor P2 after the signal of high data has been transferred to the receiving part.

The operation of the other data bus sense amplifier 40 and receving part 50 is identicel with that of the data transfer device illustrated above. In general, there is a plurality of data bus sense amplifiers and receving parts in the data transfer device.

As shown in FIG. 1 and illustrated above, the conventional data transfer device comprises a plurality of post charge logic circuits, each of which is provided on the each data line, resulting in an increase in the power consumption and an increase in a layout area.

SUMMARY OF THE INVENTION

Accordingly, the present invention for resolving the above illustrated problems is directed to a data transfer device with a post charge logic circuit which performs a post charge operation to a plurality of data line pairs by using of the signals only one data line pair.

To achieve the above object, a data transfer device according to the present invention includes: a plurality of data transferring means; a plurality of data line pairs; a plurality of driving means connected between each of the data lines and ground voltage; a plurality of data receiving means connected to a plurality of driving means through a plurality of data line pairs; and a post charge logic means for receiving a pair of data onto a pair of data line pair of the plurality of data line pairs and for performing a post charge operation at all of the plurality of data line pairs.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENTS

A preferred embodiment of the present invention will now be described in detail with reference to the accompanying drawings.

Figure 1:
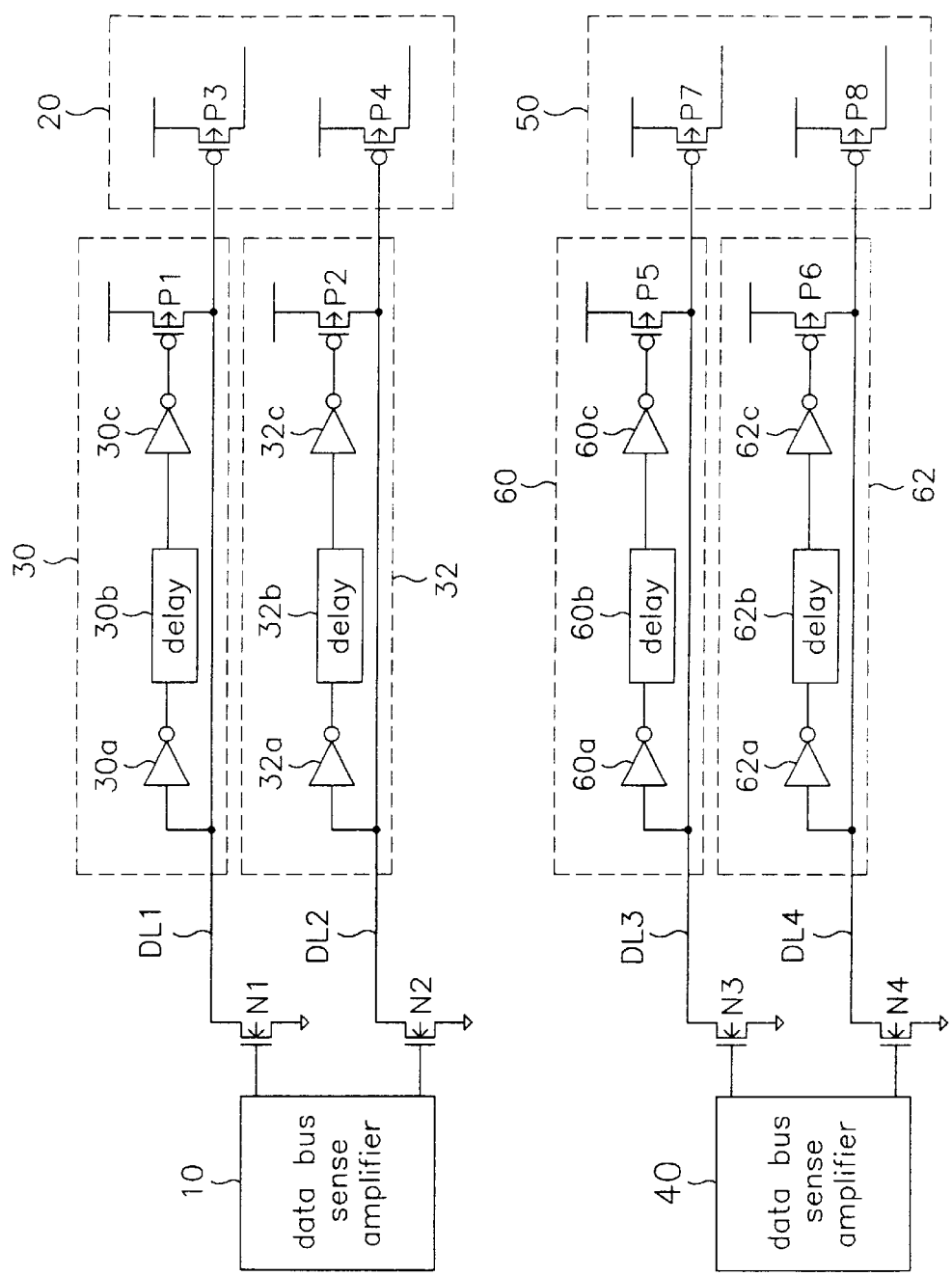
FIG. 1 is a circuit diagram of a conventional data transfer device with a post charge logic circuit.
Figure 2:
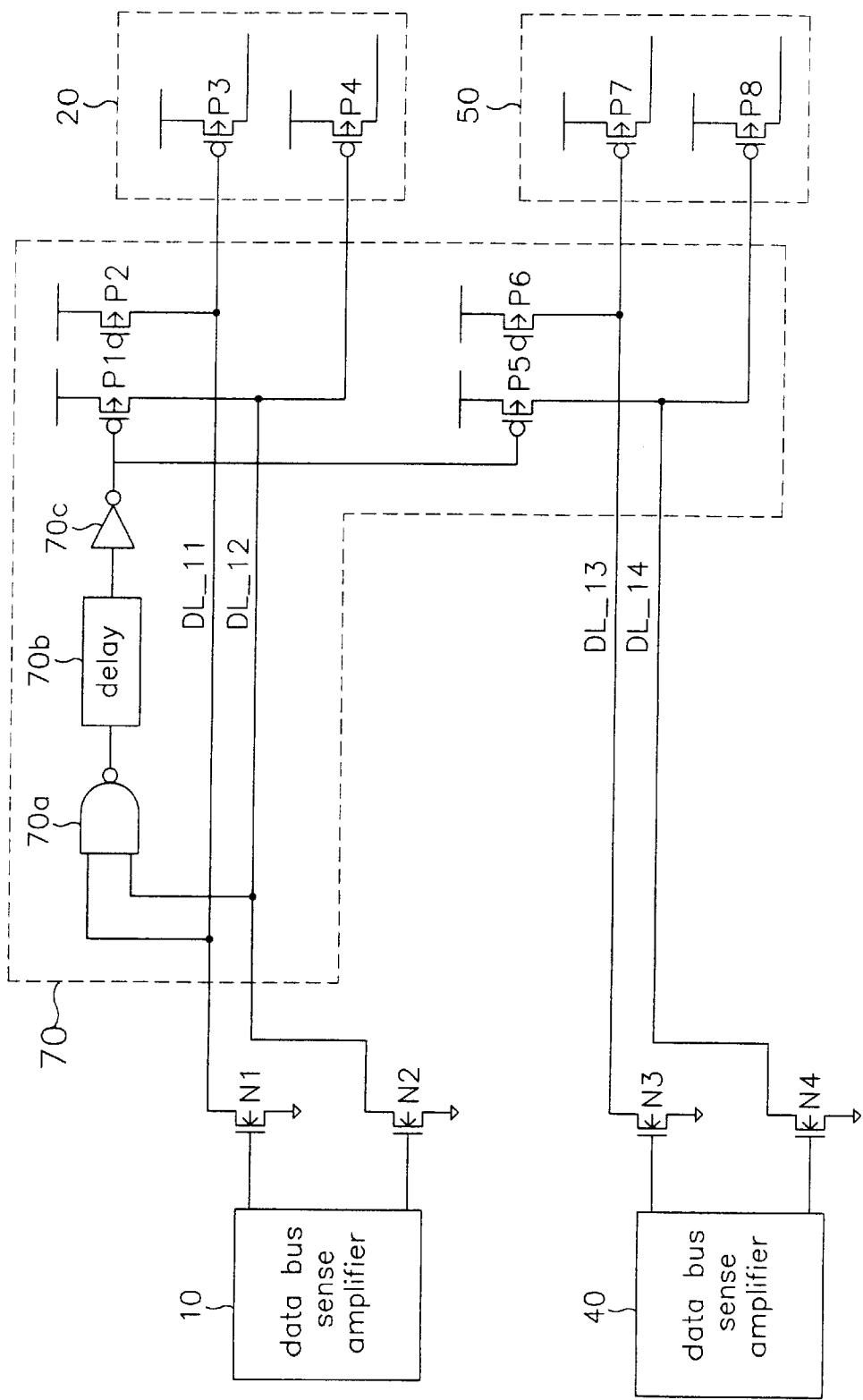
FIG. 2 is a circuit diagram of a data transfer device with a post charge logic circuit in accordance with the present invention.

FIG. 2 shows a circuit diagram of a data transfer device with a post charge logic circuit in accordance with the present invention. Each of the data driving elements N1, N2, N3, and N4 (MOS transistors) is provided between the corresponding data lines DL_11, DL_12, DL_13, and DL_14 and the ground voltage, and is operated by the output signal from the data transferring circuit (10, 40 : i.e., data bus sense amplifier).

The data lines DL_11, DL_12, DL_13, and DL_14 are connected between the corresponding drains of the data driving elements and the corresponding gates of the PMOS transistors P3, P4, P7, and P8 within the receiving parts 20 and 50. The data lines transfer the data from the data transfer devices 10 and 40 to the receiving parts 20 and 50 by the turn on/off operation of a plurality of the data driving elements N1, N2, N3, and N4.

The post charge logic circuit 70 receives only the signals on one data line pair among a plurality of data line pairs DL_11, DL_12 and DL_13, DL_14 and intializes all the data line pairs.

The post charge logic circuit 70 comprises a NAND gate 70a, a delay circuit 70b for receiving the output signal from the NAND gate 70a and delaying it for a certain amount of time, an inverter circuit 70c for receving the output signal from the delay circuit 70b, and a plurality of PMOS transistors P1, P2, P5, and P6 of which the gates for each transistor are connected to the output terminal of the inverter 70c.

The input terminals of the NAND gate 70a are connected to the data lines DL_11, DL_12, so that the signals on the data lines are NAND operated by the NAND gate 70a.

Each of the PMOS transistors P1, P2, P5, and P6 is provided between the power supply voltage and the corresponding data lines DL_11, DL_12, DL_13 and DL_14, and all of the gates of the transistors are connected to the output terminal of the inverter 70c. Thus, the voltage level of the data lines may be determined by the output signal from the inverter 70c.

The operation of the data transfer device with the post charge logic in accordance with the present invention will be explained hereinafter.

First, the operation which transfers high level data to the receiving parts 20 and 50 will be illustrated.

In the beginning, the voltage levels of the data lines DL_11, DL_12, DL_13, and DL_14 are predetermined by a pheriperal circuit (not shown), and generally are set at a high level. At this time, the status of the data driving elements N1, N2, N3, and N4 is maintained in a turned off state. In this case, the data driving elements N1 and N3 are turned on and the data driving elements N2 and N4 are selectively turned off by the output signals from the data bus sense amplifiers 10 and 40. Therefore, the voltage levels of the data lines DL_12 and DL_14 are maintained in a high level, and the voltage levels of the other data lines DL_11 and DL_13 will be changed from a high level to a low level.

The voltage level of the data lines DL_11 to DL_14 is maintained at a high level which is a initial voltage state until the voltage level of the data lines DL_11 and DL_13 have changed to a low level. Therefore, the NAND gate 70a within the post charge logic circuit 70 outputs a of high level signal, and the PMOS transistors P1, P2, P5, and P6 are turned off by the high level output signal from the inverter 70c.

From now on, when the voltage levels of the data lines DL_11 and DL_13 are changed to a low level, the PMOS transistor P3 in a receiving part 20 and the PMOS transistor P7 in a receiving part 50 are turned on. Thus, a high level signal is transferred to the receiving parts 20 and 50.

In this way, when the voltage levels of the data lines DL_11 and DL_13 are changed to a low level, the output signal from the NAND gate 70a within the post charge logic circuit 70 is changed to a high level, and the PMOS transistors P1, P2, P5, and P6 are ultimately turned on by the output signal from the inverter 70c. Thus, a high level signal is transferred to the receiving parts 20 and 50, and the voltage levels of the data lines DL_11, DL_12, DL_13, and DL_14 which are connected to the turned-on PMOS transistors P1, P2, P5, and P6 are initialized again at high levels.

On the contrary to the above case, the operation which transfers low level data to the receiving parts 20 and 50 will be illustrated.

In the beginning, the voltage levels of the data lines DL_11, DL_12, DL_13, and DL_14 are predetermined by a pheriperal circuit (not shown), and generally are set at a high level. At this time, the status of the data driving elements N1, N2, N3, and N4 is maintained in a turned off state. In this case, the data driving elements N2 and N4 are turned on, and the data driving elements N1 and N3 are selectively turned off by the output signals from the data bus sense amplifiers 10 and 40. Therefore, the voltage levels of the data lines DL_11 and DL_13 are maintained at a high level, and the voltage levels of the other data lines DL_12 and DL_14 will be changed from a high level to a low level.

The voltage level of the data lines DL_11 to DL_14 is maintained at a high level which is a initial voltage state until the voltage levels of the data lines DL_12 and DL_14 have been changed to low levels. Therefore, the NAND gate 70a within the post charge logic circuit 70 outputs a low level signal, and the PMOS transistors P1, P2, P5, and P6 are turned off by the high level output signal from the inverter 70c.

From now on, when the voltage levels of the data lines DL_12 and DL_14 are changed to a low level, the PMOS transistor P4 in a receiving part 20 and the PMOS transistor P8 in a receiving part 50 are turned on. Thus, a low level signal is transferred to the receiving parts 20 and 50.

In this way, when the voltage levels of the data lines DL_12 and DL_14 are changed to a low level, the output signal from the NAND gate 70a within the post charge logic circuit 70 is changed to a high level, and the PMOS transistors P1, P2, P5, and P6 are ultimately turned on by the output signal from the inverter 70c. Thus, a low level signal is transferred to the receiving parts 20 and 50, and the voltage levels of the data lines DL_11, DL_12, DL_13, and DL_14 which are connected to the turned-on PMOS transistors P1, P2, P5, and P6 are initialized again at high levels.

As described above, in an operation of transferring data through data lines, the present invention conducts the post charge operation to a plurality of data lines by using the signals on the one pair of data lines, thereby reducing the area of the memory device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of a patentable novelty that reside in the present invention, including all features that would be treated as equivalents thereof by those skilled in the art to which this invention pertains.

What is claimed is:

1. A data transfer device comprising, a plurality of data line pairs;

a plurality of driving means connected between each of the data lines and ground voltage;

a plurality of data receiving means connected to a plurality of driving means through a plurality of data line pairs; and a post charge logic means for receiving a pair of data onto a pair of data line pair of the plurality of data line pairs and for performing a post charge operation at all of the plurality of data line pairs.

2. A data transfer device as set forth in claim 1, wherein the post charge logic means includes a detector means for detecting the voltage levels on the pair of data lines; and a initializing means for initializing the voltage levels of the plurality of data line pairs in responce to the output signal from the detector means.

3. A data transfer device as set forth in claim 2, wherein the detector means includes a NAND means for receiving the voltage levels on the pair of data lines;

a delay means for delaying an output signal from the NAND means; and a inverter means for inverting the output signal from the delay means and for providing an inverted signal to the initializing means.

4. A data transfer device as set forth in claim 2, wherein the initializing means includes a plurality of MOS transistors, each transistor coupled between a power supply voltage and a corresponding data line.

5. A data transfer device as set forth in claim 3, wherein the initializing means includes a plurality of MOS transistors, each transistor coupled between a power supply voltage and a corresponding data line.

6. A data transfer device comprising, a plurality of data transferring means;

a plurality of data line pairs connected to the plurality of data transferring means;

a plurality of driving means connected between each of the data lines and ground voltage;

a plurality of data receiving means connected to a plurality of driving means through a plurality of data line pairs; and a post charge logic means for receiving a pair of data onto a pair of data line pair of the plurality of data line pairs and for performing a post charge operation at all of the plurality of data line pairs.

* * * * *